United States Patent [19]

Bartels

[11] 4,385,430

[45] May 31, 1983

[54] METHOD OF FORMING AN ENERGY CONCENTRATOR

[75] Inventor: Frederick T. C. Bartels, Lake View Terrace, Calif.

[73] Assignee: Spectrolab, Inc., Sylmar, Calif.

[21] Appl. No.: 274,939

[22] Filed: Jun. 18, 1981

Related U.S. Application Data

[62] Division of Ser. No. 177,306, Aug. 11, 1980, Pat. No. 4,301,321.

[51] Int. Cl.³ .......................... B23P 3/00; B23P 25/00
[52] U.S. Cl. ........................................ 29/458; 29/469.5
[58] Field of Search ............... 29/469.5, 458; 350/292, 350/293, 286, 27, 294, 211; 362/261; 136/246; 126/438, 425, 439, 424, 426

[56] References Cited

U.S. PATENT DOCUMENTS 4,022,184  5/1977  Anderson ............................. 126/425
4,120,565 10/1978  Rabl et al. ....................... 350/293 X
4,154,219  5/1979  Gupta et al. .................... 350/293 X Primary Examiner—Charlie T. Moon
Attorney, Agent, or Firm—David W. Collins; W. J. Bethurum; A. W. Karambelas

[57] ABSTRACT

A focusing multi-point high-concentrator optical system is disclosed. The system is useful for concentrating energy such as solar radiation for use in solar energy conversion systems. The configuration of the optical system incorporates thin metallized Fresnel reflector elements applied to panels formed into focusing surfaces having a common axis. The Fresnel elements are oriented axially to the axis of the focusing surfaces. The optical configuration produces a substantially rectangular focal zone centered over each panel. For a plurality of panels of a given width, there will be a plurality of focal zones, each separated by a distance equivalent to the panel width. At least one energy absorber is maintained substantially at each focal zone and may comprise a photovoltaic cell, thermal absorber, etc. and combinations thereof.

7 Claims, 6 Drawing Figures

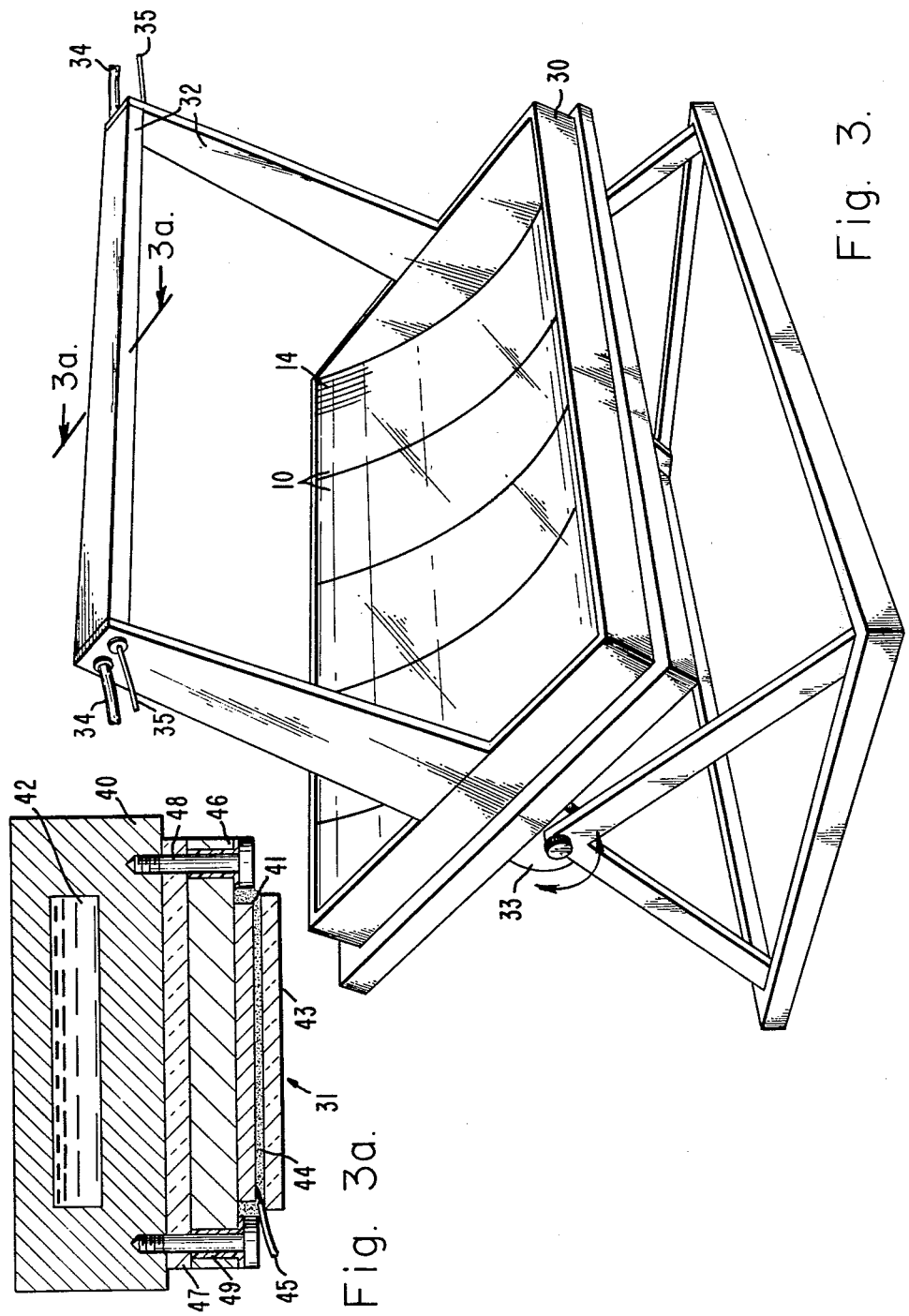

METHOD OF FORMING AN ENERGY CONCENTRATOR

This is a division of application Ser. No. 177,306, filed Aug. 11, 1980 now U.S. Pat. No. 4,301,321 issued Nov. 17, 1981.

BACKGROUND OF THE INVENTION

1. Field of the Invention

This invention relates to energy concentrators, and, more particularly, to low-cost concentrators for concentration of solar energy.

2. Description of the Prior Art

While solar energy can be collected and transformed into a useful energy form without concentration, it is well-known that the value of the energy or the cost of the collecting system, or both, can be improved by means of optical concentration. For example, in solar thermal collectors, optical concentration results in higher temperatures and lower thermal losses; in photovoltaic collectors, optical concentration reduces the number of expensive solar cells required for a given energy output. Many types of optical concentrators for solar energy applications have been discussed in the literature.

For the purpose of this discussion, optical concentrators for solar energy can be divided into two classes: single-axis (line focusing) and two-axis (point focusing). Single-axle concentrators, such as parabolic troughs and linear Fresnel reflectors and lenses, are less expensive but are limited in attainable concentration ratio. Also, the line focus requires an absorber for the concentrated solar energy in the form of a linear strip, which is inconvenient for photovoltaic absorbers, since solar cells are most readily produced in a circular shape. Two-axis concentrators do not have these disadvantages, but they are more expensive to produce and also require tracking of the sun in two axes, which requires an expensive and complex gimbal mount.

Thus, there is a need for a two-axis optical concentrator for solar energy systems which would achieve concentration ratios higher than can feasibly be obtained from a single-axis optical concentrator, yet would not be substantially more expensive to fabricate. This invention meets this need, and in addition can be designed so that the concentration ratios in the two axes are unequal, if desired. In many cases, this allows considerable savings in the design of the tracking mount, so that a two-axis concentrating solar collector can be fabricated at only slightly higher cost than a single-axis unit.

SUMMARY OF THE INVENTION

In accordance with the invention, an energy concentrator comprises:

(a) one or more panels comprising at least one Fresnel reflector element per panel, each Fresnel reflector element having grooves arranged in a substantially linear configuration so as to reflect incident radiant energy into a substantially rectangular focal zone, and each Fresnel reflector element curved about an axis perpendicular to the grooves so that the focal zone is shorter than the length of the Fresnel reflector element;

(b) one or more energy absorbers associated with each panel, upon which the reflected energy is focused;

(c) means for extracting the absorbed radiant energy from each absorber;

(d) means for supporting each absorber in the focal zone of the reflector; and (e) means for maintaining the entire panel assembly in a position so that the reflector aperture is substantially normal to the direction of the source of the incident radiant energy.

Preferably, radiant energy provided by the sun is employed in the practice of the invention. Accordingly, items described in (b) through (e) above may be of any form known and described in the prior art and literature, according to the needs and specifications of the solar energy conversion system of which the energy concentrator forms a part. The novel features of this invention are connected with the reflector element and panel described in (a) above and the combination with the other elements.

The principle of the invention may be understood from the following brief description. Consider a flat, planar Fresnel reflector; i.e., a flat sheet of optically transparent material, grooved on one surface, with the grooved surface coated with an optically reflective material, and with radiant energy incident upon the uncoated surface in a direction normal to the plane of the reflector. By proper choice of the angles and spacings of the grooves as is taught in the prior art, the radiant energy will be reflected and focused in a rectangular zone whose length (in the direction parallel to the grooves) is the same as the length of the reflector, and whose width is substantially smaller than the width of the reflector, thus providing concentration of the incident energy in the focal zone.

Now consider that this Fresnel reflector is bent into a curve about an axis perpendicular to the direction of the grooves. As a result, the focal zone will become shorter in length, providing increased concentration of the incident radiant energy. Because as a result of bending the reflector all parts of the reflective surface are now no longer normal to the direction of the incident radiation, optical aberrations are introduced which have the effect of slightly widening the focal zone. Nevertheless, a large increase in the optical concentration ratio can be achieved.

Note that focusing in each axis is achieved by entirely independent means. Focusing in the "width" dimension (perpendicular to the reflector grooves) results from the action of the grooves and is determined by their configuration, while focusing in the "length" dimension (parallel to the reflector grooves) results from the curvature of the entire reflector panel and its determined by the degree of curvature introduced by bending.

Since focusing in each axis is independently determined, there is no requirement that the degree of concentration in each axis shall be equal. The total concentration ratio of the reflector is equal to the product of the concentration associated with each axis.

As will be further discussed, manufacturing methods exist which permit the fabrication of a highly accurate grooved surface which will provide close to the maximum concentration of incident solar energy that is theoretically obtainable in the "width" dimension. Thus, the curvature introduced in the orthogonal dimension need only be great enough to increase the total concentration ratio to the desired level. In principle, it is well-known that the required accuracy of fabrication of the reflective surface, and also the required accuracy of tracking of the direction of the incident energy, is related to and substantially proportional to the concentration ratio. Therefore, if the required concentration ratio is moderate, the accuracy with which the curvature is formed and maintained, and also the accuracy with which the reflector is maintained normal to the direction of the incident energy in the "length" dimension, need not be great. In an important specific embodiment, if the concentration ratio in one axis is quite small (e.g., five), that axis need not be tracked continually if seasonal adjustment is provided.

Achievement of substantially higher concentration ratios than can be achieved by a conventional linear Fresnel reflector can be obtained through the means disclosed herein, with a very modest increase in cost.

Note also that the dimensions of the focal zone are related to the corresponding dimensions of the reflector by the concentration ratios associated with each axis. By suitable choosing reflector dimensions, focal length and curvature, a focal zone can be produced which varies from a long, narrow rectangle to a near-circular spot. Thus, this invention provides means by which the configuration of the focal zone can be adapted to the requirements of the absorber element, over a wide range of dimensions and configurations.

BRIEF DESCRIPTION OF THE DRAWING

FIG. 3 depicts a mounted array of solar concentrator panels; and

FIG. 3a is an enlarged view of a cross-section portion of FIG. 3 along 3a—3a.

DETAILED DESCRIPTION OF THE INVENTION

The description which follows below is given generally in terms of a solar concentrator and its fabrication. However, it will be understood that the apparatus and method of the invention may be used, with appropriate simple modifications, to concentrate energy from a variety of radiant sources such as infrared, microwave, etc., and for a variety of applications.

The energy concentrator of the invention includes one or more panels comprising at least one Fresnel reflector element per panel capable of generating a substantially rectangular focal zone, arranged such that the focal zones of multiple elements are substantially aligned, each panel curved about a common axis to form a focusing surface. By focusing surface is meant a surface which provides a zone to which rays converge, and includes parabolic, elliptical, spherical and hyperbolic surfaces, combinations of these, and other curved surfaces.

A Fresnel reflector element, as is well-known, comprises a reflecting surface made up of segments that approximate a curved surface. The segments may be planar or curved. The segmented construction provides the optical performance of a thick element in a thin sheet, thereby reducing cost. The type of Fresnel reflector utilized in the practice of the invention is a "linear" Fresnel in which the segments are formed by parallel grooves in a transparent sheet. A suitable Fresnel reflector may be formed in a variety of transparent plastic materials by casting, molding, extruding or embossing processes, followed by metallization of the grooved surface by well-known methods. Acrylic Fresnel strips, with approximately 50 segments or grooves per inch, are commercially available, for example, from 3M Company (Minneapolis, MN) and are suitably employed in the practice of this invention.

The bending of a linear Fresnel mirror element or reflector into a focusing surface provides focusing in two principal planes. The curvature of the element itself provides focusing in one principal plane. Focusing in the orthogonal plane is provided by the Fresnel reflector element as a result of the geometric surface it approximates. Consequently, a substantially rectangular focal zone is generated rather than a line focus. The precise curve of bending which provides optimum focusing depends on the desired concentration ratio and is intermediate a circle and a parabola; i.e., elliptical.

Figure 1:
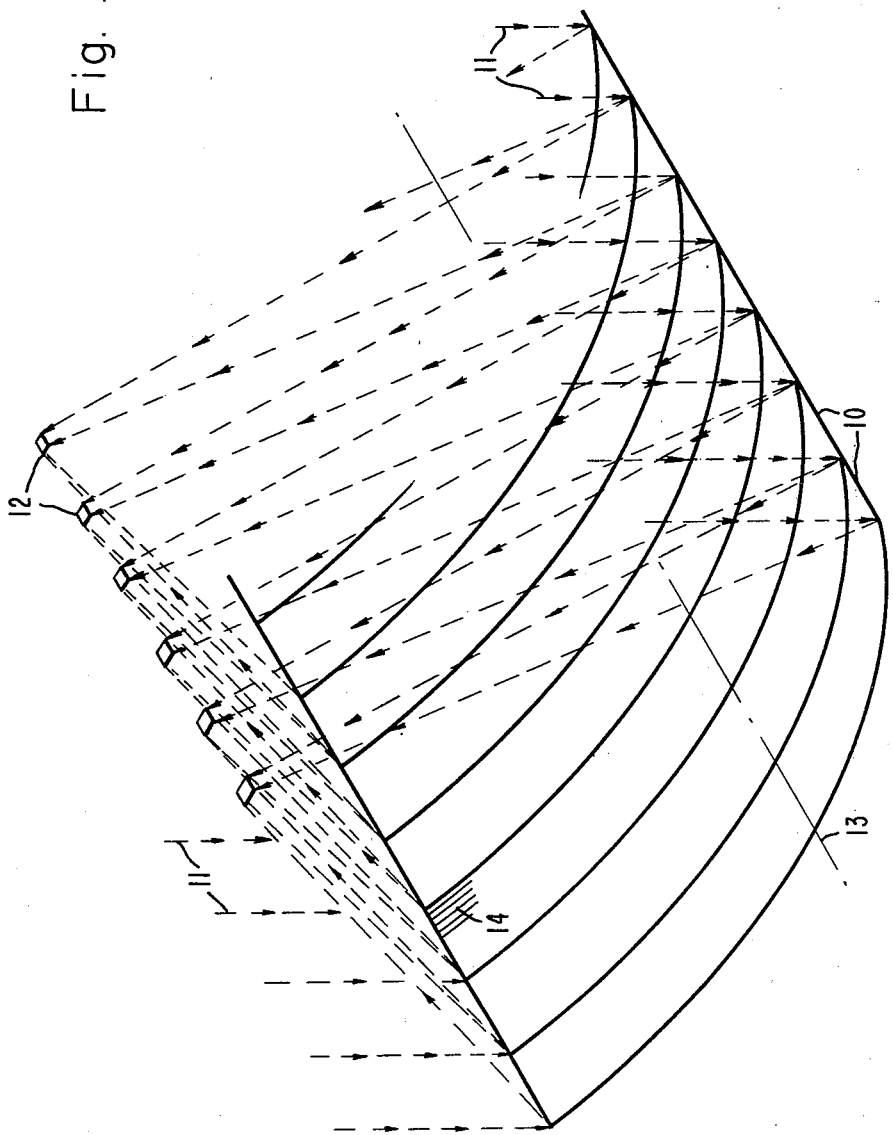
FIG. 1 is a perspective view, partly schematic, of an array of concentrator panels of the invention.

FIG. 1 depicts in perspective a plurality of panels 10 comprising at least one Fresnel reflector element for reflecting and concentrating incident radiant energy 11. Centered over each panel is a discrete, substantially rectangular focal zone 12. It will be noted that the distance between focal zones for each panel is equivalent to the width of each panel. More than one Fresnel reflector element may be employed to form a panel, providing the focal zones of all elements forming the panel are substantially aligned.

Each panel 10 is curved about a common axis 13 to form a focusing surface. The segments of grooves 14 of the Fresnel reflector elements are aligned substantially perpendicular (axial) to the axis of the focusing surfaces. For clarity, only a portion of the grooves is depicted. As described above, the combination of curved focusing surface and Fresnel reflector segments generates a substantially rectangular focal zone. The rectangular focal zone can be more effectively utilized by rectangular groups of solar energy absorber cells than can a line focus.

The panel can be of any length suitable for the application, since the Fresnel portion can be repeated along its length to produce multiple foci 12, as shown in FIG. 1.

FIG. 2 shows cross-sectional views (not to scale), normal to the grooves 14, of examples of a reflector panel useful in the practice of the invention.

Figure 2C:
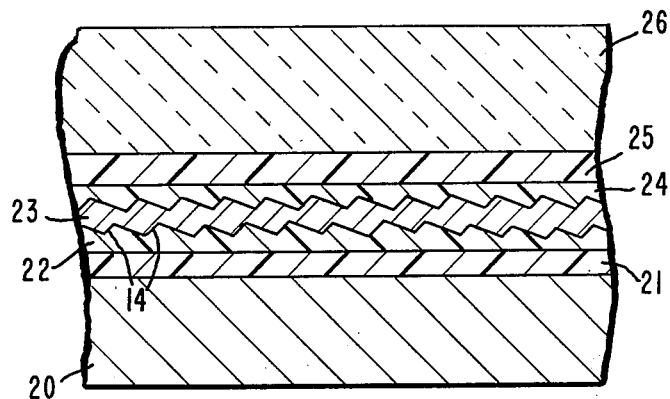
FIGS. 2a-c are cross-sectional views of a Fresnel mirror assembly useful in the practice of the invention.
Figure 2A:
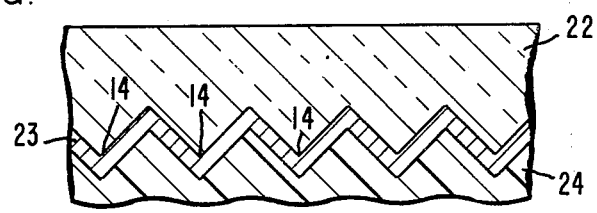

The simplest reflector panel containing all essential elements of the invention is shown in FIG. 2a. This panel comprises a sheet of optically transparent material 22 with the Fresnel grooves 14 formed in one surface. The radiation is incident upon the un-grooved surface, and the grooved surface is coated with a reflective layer 23, which may in turn be coated with a protective coating 24.

Figure 2B:
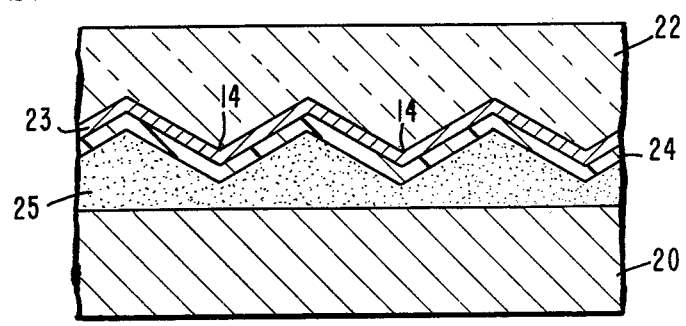

In the panel design shown in FIG. 2a, the transparent sheet must be thick and rigid enough to maintain the required curvature under the environmental conditions of service. It will usually be found that a lower cost and more satisfactory alternative design can be achieved by utilizing a thinner sheet of transparent material supported by a substrate, which may be metal or any other material having suitable mechanical properties. A design of this form is shown in FIG. 2b. This design differs from the simpler design of FIG. 2a in that a supporting substrate 20 has been added, and the Fresnel reflector assembly 22, 23, 24 is bonded to this substrate with an adhesive layer 25.

In the design shown in FIG. 2b, the upper surface of the transparent sheet 22 is exposed to environmental attack, and in many applications it will be found that the plastic materials which are the most satisfactory choice for this design element are insufficiently resistant to environmental attack to provide the desired service life.

In this case a still more complex design may be chosen, as shown in FIG. 2c. In FIG. 2c, the reflector assembly comprises a substrate 20, bonded to which by an adhesive 21 is the Fresnel reflector 22 having grooves or segments 14 as described above. The substrate, which may be an aluminum sheet, e.g., 0.060 inch thick, supplies the necessary flatness and support for the Fresnel reflector. A reflective layer 23 is applied to the Fresnel reflector and is protected by coating 24. A glass sheet 26 is bonded to the protective coating by adhesive 25 to provide further environmental protection for the assembly. An example of a suitable glass is Code 0313, available from Corning Glass Works (Corning, NY).

The reflective layer 23 may be any highly reflecting material. For highest reflectivity, the reflective layer is silver; it provides a 6.2% reflectance increase over aluminum, which may also be used. The reflective layer is conveniently vacuum-deposited on the linear Fresnel substrate (layer 22) and substantially replicates grooves 14.

An acrylic sheet with linear Fresnel grooving 14 conveniently serves as the reflector 22; however, glass and polymers which are environmentally stable and are compatible with the reflective layer may also be employed. Note that in this design the reflector 22 has been inverted, so that it is no longer necessary that it be optically transparent.

Before bonding to the glass, it may be desirable to protect the reflective layer 23 from the adhesive layer 25, especially if the reflective layer is silver. A suitable coating comprises a layer 24 of Vistar protective silicon finish sprayed over the silver and is available from Dow-Corning (Midland, MI) under the designation Q9-6503. The various layers comprising the assembly may be bonded together by a variety of processes well-known in the art; a particularly convenient choice is vacuum lamination.

FIG. 3 depicts an array of curved panels, each comprising at least one Fresnel mirror element 10, supported on support means 30. A portion of segments or grooves 14 is depicted. A substantially rectangular focal zone (not shown) is associated with each panel. At least one radiant energy absorber 31 (FIG. 3a) is operably associated with each panel, maintained in place by support means 32. The array may be moved by means 33 on one or two axes to track the sun, employing well-known technology.

Each absorber is maintained substantially at the focal zone, thus receiving solar radiation reflected from and concentrated by the panel. The radiant energy absorber may be any of those commonly known in the art such as photovoltaic cells, thermal absorbers and the like, and combinations of these.

For example, as shown in FIG. 3a, which is an enlarged portion through section 3a—3a of FIG. 3, a high heat conducting conduit 40, e.g., copper, provides support for solar photovoltaic cells 41, as well as conducting heat to a liquid 42 which is used to extract heat, which may be further utilized by well-known means (not shown). A glass cover 43 and encapsulant 44 protect the solar cells. The encapsulant is substantially transparent over the radiation range of the solar cells. Electrical contact is made to the front of the solar cells by means 45, such as conducting wire, and to the back by means 46, such as a metallic substrate. Layer 47 electrically isolates the cells from the conduit. Fastening means 48 is used to assemble the apparatus and is electrically insulated from metallic substrate 46 by insulation 49.

Referring to FIG. 3, external connections 34 provide for recirculating the liquid through a thermal absorber, while electrical connections 35 provide output voltage from the solar cells.

The various radiant energy adsorbers mentioned above are all well-known and hence do not form a part of the invention. By further elaboration of the designs, involving the combination of optical elements constructed in accordance with the teachings of the invention with other well-known elements, the energy concentrator described herein may be adapted to a wide variety of applications, as will be readily recognized by those skilled in the art. The overall performance of an energy concentrator constructed in accordance with this invention can most accurately be determined by ray-tracing methods, which are well-known to designers of optical systems.

What is claimed is:

1. A method of forming an energy concentrator comprising:
(a) bending a panel to form a concave focusing surface curved about an axis, at least a portion of whose concave surface includes at least one Fresnel reflector element, the grooves of which Fresnel reflector element are so arranged as to lie substantially perpendicular to the axis of said focusing surface, thereby generating a substantially rectangular focal zone;
(b) supporting at least one panel such that the axis at each focusing surface is substantially aligned to form a common axis, the at least one panel being supported in a position to intercept and reflect incident radiant energy; and
(c) supporting at least one energy absorber at substantially the focal zone of each panel.

2. The method of claim 1 in which the concentrator is formed and supported so as to intercept and reflect solar radiation.

3. The method of claim 2 in which the at least one energy absorber are selected from the group consisting of photovoltaic cells and thermal absorbers.

4. The method of claim 1 in which the at least one panel are formed as surfaces chosen from the class of conic sections.

5. The method of claim 1 in which the at least one Fresnel reflector element are formed by bonding a Fresnel surface to a compliant substrate, coating the Fresnel surface with a reflective material and bonding a transparent protective surface thereto.

6. The method of claim 5 in which the Fresnel reflector elements comprising a Fresnel surface and a back are formed by coating a Fresnel surface with a metal selected from the group consisting of silver and aluminum, bonding the back to a compliant sheet of aluminum and bonding a transparent, compliant sheet of glass to the Fresnel surface.

7. The method of claim 6 in which the Fresnel surface is coated with silver, which is in turn coated with a protective layer prior to bonding the sheet of glass thereto.

* * * * *